(12) United States Patent
Jeon et al.

(10) Patent No.: US 10,609,821 B2
(45) Date of Patent: Mar. 31, 2020

(54) DISPLAY DEVICE

(71) Applicant: Samsung Display Co., Ltd., Yongin-si, Gyeonggi-do (KR)

(72) Inventors: Myoung-Ha Jeon, Asan-si (KR); Ki Chang Lee, Gwacheon-si (KR); Jin Ho Kim, Daegu (KR); Hyeon Jeong Oh, Yeosu-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/221,178

(22) Filed: Dec. 14, 2018

(65) Prior Publication Data

US 2019/0380209 A1    Dec. 12, 2019

(30) Foreign Application Priority Data

Jun. 12, 2018  (KR) .................. 10-2018-0067551

(51) Int. Cl.
| | | |
|---|---|---|
| *G06F 1/16* | (2006.01) | |
| *H05K 5/00* | (2006.01) | |
| *H05K 7/00* | (2006.01) | |
| *H05K 1/18* | (2006.01) | |
| *H01L 27/15* | (2006.01) | |
| *H01L 33/52* | (2010.01) | |
| *G06F 3/041* | (2006.01) | |
| *H01L 33/44* | (2010.01) | |

(52) U.S. Cl.
CPC ........... *H05K 1/189* (2013.01); *G06F 3/0412* (2013.01); *H01L 27/156* (2013.01); *H01L 33/44* (2013.01); *H01L 33/52* (2013.01); *H05K 2201/10128* (2013.01)

(58) Field of Classification Search
CPC ......... H05K 1/189; G06F 3/0412; G06F 1/16; G06F 1/1601; G06F 1/1607
USPC ............... 361/679.01, 679.02, 679.21–679.3
See application file for complete search history.

(56) References Cited

U.S. PATENT DOCUMENTS

| | | |
|---|---|---|
| 9,287,329 B1 | 3/2016 | Lee et al. |
| 10,229,632 B2* | 3/2019 | Chung .................... G06F 3/147 |
| 2014/0002385 A1* | 1/2014 | Ka ........................ G06F 1/1601 |
| | | 345/173 |
| 2016/0179229 A1 | 6/2016 | Ahn |
| 2017/0237025 A1 | 8/2017 | Choi et al. |

FOREIGN PATENT DOCUMENTS

| | | |
|---|---|---|
| KR | 10-2007-0098183 A | 10/2007 |
| KR | 10-2017-0020674 A | 2/2017 |
| KR | 10-2017-0072999 A | 6/2017 |
| KR | 10-2017-0099944 A | 9/2017 |
| KR | 10-2017-0102181 A | 9/2017 |

* cited by examiner

*Primary Examiner* — Anthony M Haughton
(74) *Attorney, Agent, or Firm* — Lewis Roca Rothgerber Christie LLP

(57) ABSTRACT

A display device includes: a display panel including a bending region; and a flexible printed circuit film connected to the display panel, the display panel including: a substrate; a display active layer on the substrate to display an image; a protection layer on the substrate; and a polarization layer on the display active layer, and the polarization layer includes an inclination part at a side surface thereof, the protection layer covers the bending region, and a side of the protection layer is in contact with the inclination part.

16 Claims, 7 Drawing Sheets

DISPLAY DEVICE

CROSS-REFERENCE TO RELATED APPLICATION

This application claims priority to and the benefit of Korean Patent Application No. 10-2018-0067551, filed on Jun. 12, 2018 in the Korean Intellectual Property Office, the entire content of which is incorporated herein by reference.

BACKGROUND

1. Field

Aspects of embodiments of the present disclosure relate to a display device.

2. Description of the Related Art

An emissive display device having a self-luminous characteristic does not need a separate light source, unlike a liquid crystal display, and, accordingly, it can have a relatively small thickness and weight. Further, the emissive display device exhibits high-quality characteristics, such as low power consumption, high luminance, and fast response speed.

Recently, in the emissive display device, to reduce a dead space and a bezel, a flexible substrate has been applied to the emissive display device, and a bending structure has been adapted through a bending region.

The above information disclosed in this Background section is for enhancement of understanding of the background of the invention and, therefore, it may contain information that does not form the prior art that is already known in this country to a person of ordinary skill in the art.

SUMMARY

According to an aspect of embodiments of the present disclosure, damage due to bending of a display device may be prevented.

A display device according to one or more embodiments of the present invention includes: a display panel including a bending region; and a flexible printed circuit film connected to the display panel, wherein the display panel includes: a substrate; a display active layer on the substrate to display an image; a protection layer on the substrate; and a polarization layer on the display active layer, and wherein the polarization layer includes an inclination part at a side surface thereof, the protection layer covers the bending region, and a side of the protection layer is in contact with the inclination part.

The display panel may include a display area and a non-display area, and the bending region may be located at the non-display area.

The polarization layer may extend from the display area to the non-display area, and the inclination part may be located at the non-display area.

The inclination part may have a reverse-tapered shape.

The protection layer may include a photo-hardening organic material.

The flexible printed circuit film may be attached to the substrate, and another side of the protection layer may be on the flexible printed circuit film.

The display device may further include a supporting member under the substrate and including an opening overlapping with the bending region.

The display panel may be bent at the bending region.

A display device according to one or more embodiments of the present invention includes: a display panel including a bending region; and a flexible printed circuit film connected to the display panel, wherein the display panel includes: a substrate in which a through hole is located; a display active layer on the substrate to display an image; a protection layer on the substrate; and a supporting member under the substrate, and wherein the through hole penetrates the substrate and the supporting member, and the protection layer covers the bending region and includes a fixed part inside the through hole.

The through hole may be located between the bending region and the display area.

The display device may further include a polarization layer on the display active layer, and a side of the protection layer may be in contact with a side surface of the polarization layer.

The supporting member may include an opening overlapping with the bending region.

According to an aspect of embodiments of the present disclosure, adherence of the protection layer protecting the bending region may be improved, thereby preventing or reducing damage by the bending of the display device.

Figure 1:
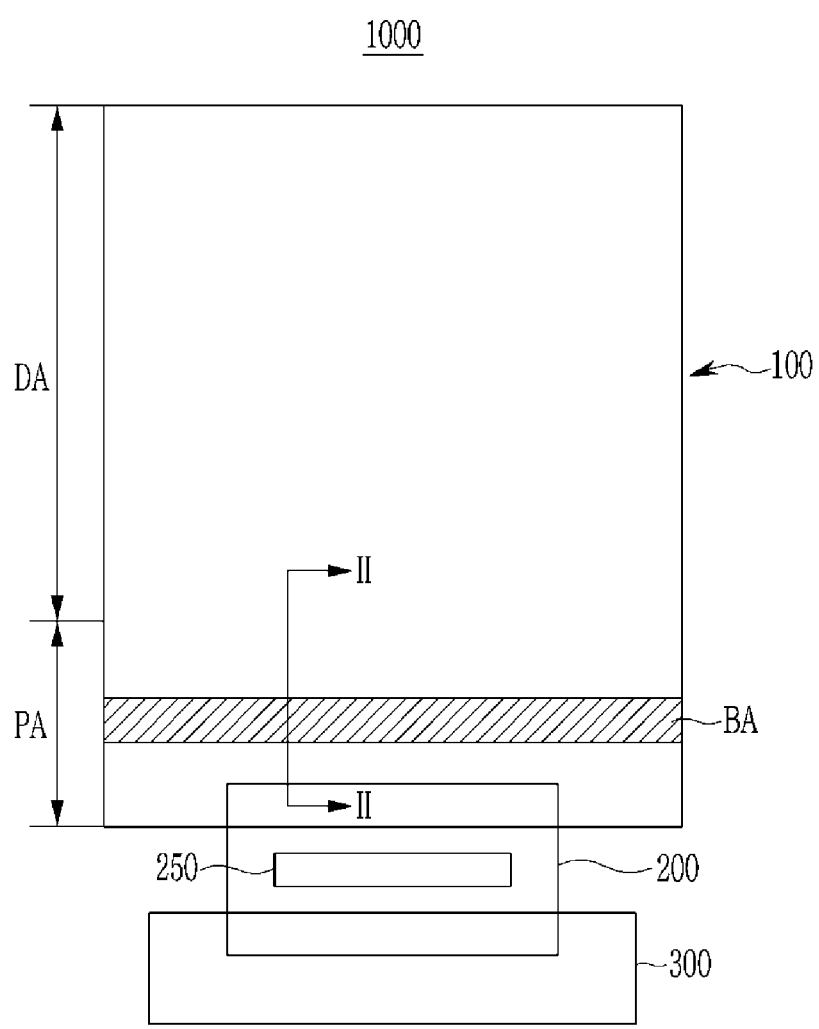
FIG. 1 is a view schematically showing an example of a layout of a display device according to an exemplary embodiment of the present invention.

| DESCRIPTION OF SYMBOLS | |
|---|---|
| 100: display panel | 110: substrate |
| 120: display active layer | 130: polarization layer |
| 135: inclination part | 140: supporting member |
| 145: opening | 150: protection layer |
| 155: fixed part | 200: flexible printed circuit film |
| 250: driving circuit unit | 300: printed circuit board (PCB) |

DETAILED DESCRIPTION

The present invention will be described more fully herein with reference to the accompanying drawings, in which some exemplary embodiments of the invention are shown. As those skilled in the art would realize, the described embodiments may be modified in various different ways, all without departing from the spirit or scope of the present invention.

The drawings and description are to be regarded as illustrative in nature and not restrictive, and like reference numerals designate like elements throughout the specification.

In the drawings, a size and thickness of each element may be arbitrarily illustrated for convenience of description, and the present invention is not necessarily limited to that as illustrated in the drawings. In the drawings, the thicknesses of layers, films, panels, regions, etc., may be exaggerated for clarity and convenience of description.

It is to be understood that when an element, such as a layer, film, region, or substrate is referred to as being "on" another element, it may be directly on the other element or one or more intervening elements may also be present. In contrast, when an element is referred to as being "directly on" another element, there are no intervening elements present. Further, in the specification, the words "on" or "above" mean positioned on, above, or below the object portion, and do not necessarily mean positioned on an upper side of the object portion based on a gravitational direction.

In addition, unless explicitly described to the contrary, the word "comprise" and variations such as "comprises" or "comprising" are to be understood to imply the inclusion of stated elements but not the exclusion of any other elements.

Further, in the specification, the phrase "on a plane" means viewing the object portion from the top, and the phrase "on a cross-section" means viewing a cross-section of which the object portion is vertically cut from the side.

Figure 2:
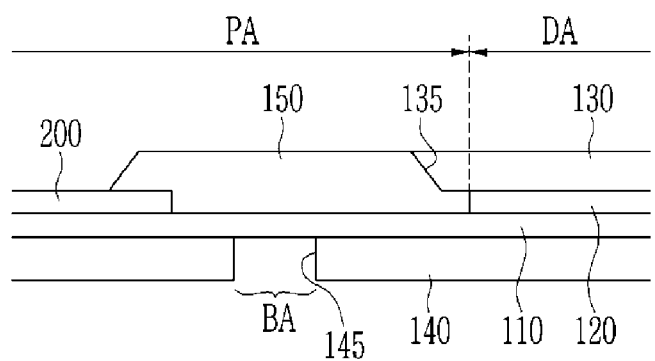
FIG. 2 is a view schematically showing an example of a partial cross-sectional view taken along the line II-II of FIG. 1.

FIG. 1 is a view schematically showing an example of a layout of a display device according to an exemplary embodiment of the present invention; FIG. 2 is a view schematically showing an example of a partial cross-sectional view taken along the line II-II of FIG. 1; and FIG. 3 is a view schematically showing a partial side view of a state in which the display device of FIG. 1 is bent.

Figure 3:
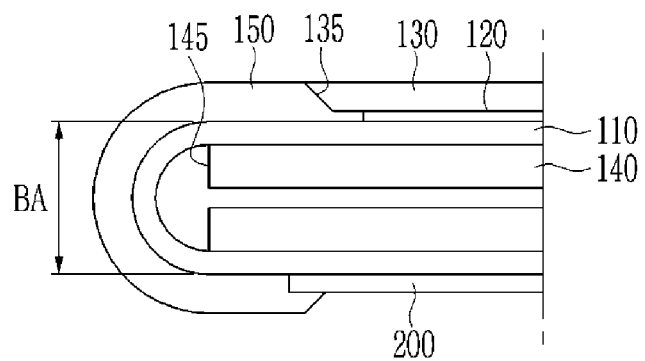
FIG. 3 is a view schematically showing a partial side view of a state in which the display device of FIG. 1 is bent.

Referring to FIG. 1 to FIG. 3, a display device 1000 according to the present exemplary embodiment includes a display panel 100, a printed circuit board (PCB) 300, and a flexible printed circuit film 200 connecting the display panel 100 and the printed circuit board (PCB) 300.

In an embodiment, the display panel 100 displays an image and senses a touch. The display panel 100 includes a display area DA to display an image, and a non-display area PA in which elements and/or wires for generating and/or transmitting various signals applied to the display area DA are formed. The display panel 100 also includes a bending area BA. The bending area BA is positioned at the non-display area PA.

The flexible printed circuit film 200 is attached to the non-display area PA of the display panel 100. A driving circuit unit 250 is disposed on the flexible printed circuit film 200.

The printed circuit board (PCB) 300 generates a driving signal for driving the display panel 100, and a plurality of signals for applying the driving signal at appropriate timing to be applied to the display panel 100 through the flexible printed circuit film 200 and the driving circuit unit 250.

The display panel 100 is bent at the bending area BA, and, accordingly, a part of the display panel 100 and the flexible printed circuit film 200 attached to the display panel 100 are disposed on a rear surface or side of the display panel 100 (referring to FIG. 3), thereby minimizing or reducing the area of the non-display area PA. In this case, although not shown in the drawings, the printed circuit board (PCB) 300 connected to the flexible printed circuit film 200 is also disposed on the rear surface or side of the display panel 100.

In an embodiment, the display panel 100 includes a substrate 110, a display active layer 120, a polarization layer 130, a supporting member 140, and a protection layer 150.

The substrate 110 includes a material having flexibility. For example, the substrate 110 may be formed of a material selected from the group consisting of polyimide (PI), polyethylene naphthalate (PEN), polycarbonate (PC), polyarylate (PAR), polyether imide (PEI), and polyether sulfone (PES).

The display active layer 120 is disposed on the substrate 110 and is disposed at the display area DA. The display active layer 120 includes a plurality of pixels displaying the image and wires connected thereto, and a plurality of insulating layers. In an embodiment, the display active layer 120 also includes a touch sensing layer for sensing the touch.

The polarization layer 130 is disposed on the display active layer 120. The display active layer 120 serves to reduce external light reflection. The polarization layer 130 extends from the display area DA to the non-display area PA, and includes an inclination part 135 disposed at a side surface thereof. The inclination part 135 is disposed at the non-display area PA. The polarization layer 130 has a shape in which a length of the upper surface is longer than a length of the lower surface, and the inclination part 135 connects the upper surface and the lower surface of the polarization layer 130 such that the inclination part 135 has a reverse-tapered shape.

The supporting member 140 is disposed under the substrate 110. The supporting member 140 supports and protects the substrate 110. In an embodiment, the supporting member 140 includes an opening 145 overlapping with the bending area BA. Accordingly, the bending of the display panel 100 may be easy in the bending area BA.

The protection layer 150 is disposed on the substrate 110. The protection layer 150 is disposed in the non-display area PA and covers the bending area BA and protects the bending area BA. As described above, the elements and/or the wires for generating and/or transmitting the various signals applied to the display area DA are disposed in the non-display area PA. Although not shown, these elements and wires are disposed on the substrate 110 along with the insulating layer. In this case, the insulating layer may include an inorganic layer or an organic layer. Here, the protection layer 150 may protect the elements, the wires, and the insulating layer disposed in the non-display area PA.

When bending the display panel 100, the wires or the insulating layers (not shown) disposed in the bending area BA are susceptible to damage by a compressive force and a tensile force due to the bending such that a crack may be generated. Also, after the bending of the display panel 100, the wires or the insulating layers (not shown) disposed in the bending area BA are susceptible to damage by vibrations and external impacts. The protection layer 150 has a function of preventing or substantially preventing the damage generated during the bending of the display panel 100 or after the bending.

In an embodiment, one side of the protection layer 150 is in contact with the inclination part 135 of the polarization layer 130, and the other side of the protection layer 150 is disposed on the flexible printed circuit film 200. The flexible printed circuit film 200 is attached to the substrate 110.

When bending the display panel 100, the adherence of one side of the protection layer 150 is weakened due to the compressive force and the tensile force such that lifting defects may be generated. In the present exemplary embodiment, as one side of the protection layer 150 is in contact with the inclination part 135 of the polarization layer 130, the adherence of the protection layer 150 is improved, and, accordingly, when bending the display panel 100, the inclination part 135 of the polarization layer 130 may prevent or substantially prevent one side of the protection layer 150 from being lifted. In an embodiment, the protection layer 150 may include a photo-hardening organic material.

In an embodiment, the display panel 100 may further include a window disposed on the polarization layer 130, and at least one functional sheet for heat radiation, light blocking, and insulation disposed under the substrate 110.

Next, a lamination structure of the display active layer 120 according to an exemplary embodiment is described.

Figure 4:
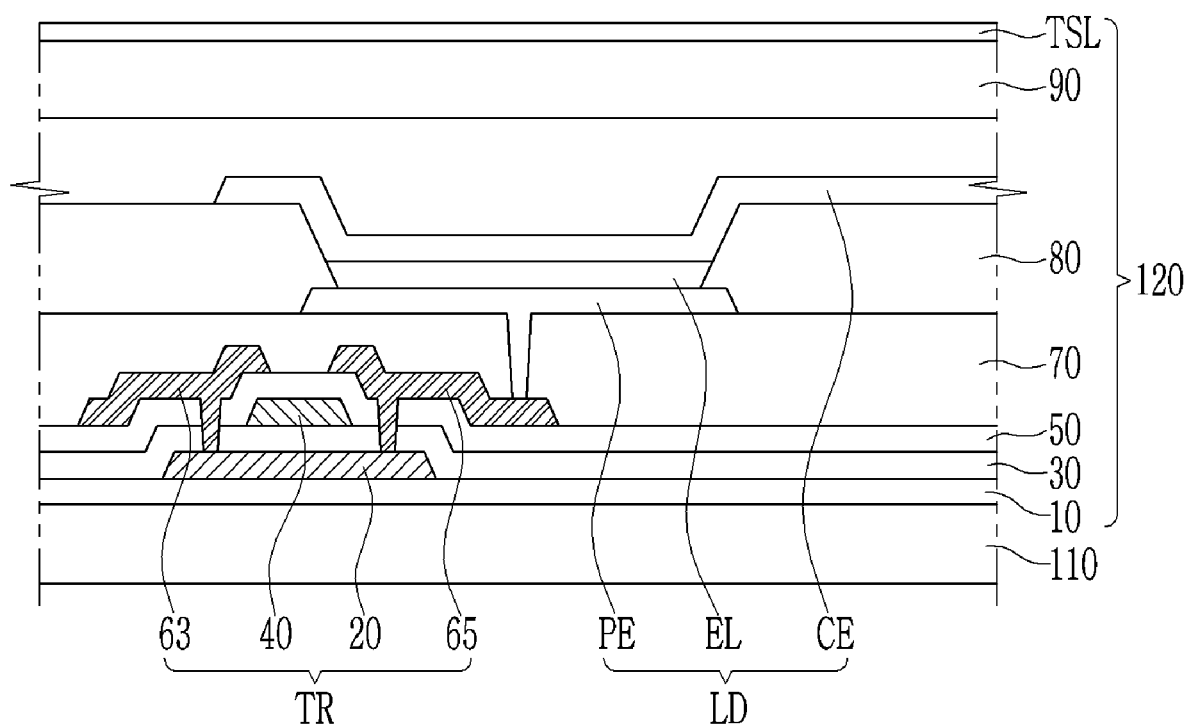
FIG. 4 is a cross-sectional view schematically showing an example of a lamination structure of a display active layer in a display device according to an exemplary embodiment of the present invention.

FIG. 4 is a cross-sectional view schematically showing an example of a lamination structure of a display active layer in a display device according to an exemplary embodiment of the present invention. The cross-sectional view shown in FIG. 4 may approximately correspond to one pixel area.

Referring to FIG. 4, in an embodiment, the display active layer 120 includes a plurality of insulating layers 10, 30, 50, 70, and 80, a transistor TR, a light emitting diode (LED) LD connected to the transistor TR, an encapsulation substrate 90, and a touch sensor layer TSL.

A buffer layer 10 is disposed on the substrate 110. The buffer layer 10 serves a function of preventing or substantially preventing an impurity that may be diffused from the substrate 110 to a semiconductor layer 20 of the transistor TR in the process of forming the semiconductor layer 20 and reducing stress applied to the substrate 110.

The semiconductor layer 20 of the transistor TR is disposed on the buffer layer 10, and a gate insulating layer 30 is disposed on the semiconductor layer 20. The semiconductor layer 20 includes a source region and a drain region, and a channel region between the source region and the drain region. In an embodiment, the semiconductor layer 20 may include polysilicon, an oxide semiconductor, or amorphous silicon. The gate insulating layer 30 may include an inorganic insulating material, such as a silicon oxide, a silicon nitride, etc.

A gate conductor including a gate electrode 40 of the transistor TR is disposed on the gate insulating layer 30. The gate conductor may include, for example, a metal such as molybdenum (Mo), copper (Cu), aluminum (Al), silver (Ag), chromium (Cr), tantalum (Ta), titanium (Ti), or a metal alloy thereof.

An interlayer insulating layer 50 is disposed on the gate conductor. The interlayer insulating layer 50 may include the inorganic insulating material.

A data conductor including a source electrode 63 and a drain electrode 65 of the transistor TR is disposed on the interlayer insulating layer 50. The source electrode 63 and the drain electrode 65 are respectively connected to the source region and the drain region of the semiconductor layer 20 through contact holes formed in the interlayer insulating layer 50 and the gate insulating layer 30. The data conductor, for example, may include a metal, such as aluminum (Al), copper (Cu), silver (Ag), molybdenum (Mo), chromium (Cr), gold (Au), platinum (Pt), palladium (Pd), tantalum (Ta), tungsten (W), titanium (Ti), nickel (Ni), etc., or a metal alloy thereof.

A passivation layer 70 is disposed on the data conductor. The passivation layer 70 may include an organic insulating material.

A pixel electrode PE is disposed on the passivation layer 70. The pixel electrode PE is connected to the drain electrode 65 through a contact hole formed in the passivation layer 70, thereby receiving a data signal controlling luminance of the light emitting diode (LED) LD.

A pixel definition layer 80 is disposed on the passivation layer 70. The pixel definition layer 80 has an opening overlapping the pixel electrode PE. In the opening of the pixel definition layer 80, an emission layer EL is disposed on the pixel electrode PE, and a common electrode CE is disposed on the emission layer EL. The pixel electrode PE, the emission layer EL, and the common electrode CE together configure the light emitting diode (LED) LD. In an embodiment, the pixel electrode PE may be an anode of the light emitting diode (LED) LD, and the common electrode CE may be a cathode of the light emitting diode (LED) LD.

The encapsulation substrate 90 protecting the light emitting diode (LED) LD is disposed on the common electrode CE. In an embodiment, a thin film encapsulation layer may be disposed instead of the encapsulation substrate 90.

In an embodiment, the touch sensor layer TSL is disposed on the encapsulation substrate 90. The touch sensor layer TSL may include a touch electrode formed of a transparent conductive material, such as ITO, IZO, a metal mesh, etc., and the touch electrode may be formed of a single layer or a multi-layer.

Next, a display device according to another exemplary embodiment of the present invention is described with reference to FIG. 5 to FIG. 7.

Figure 5:
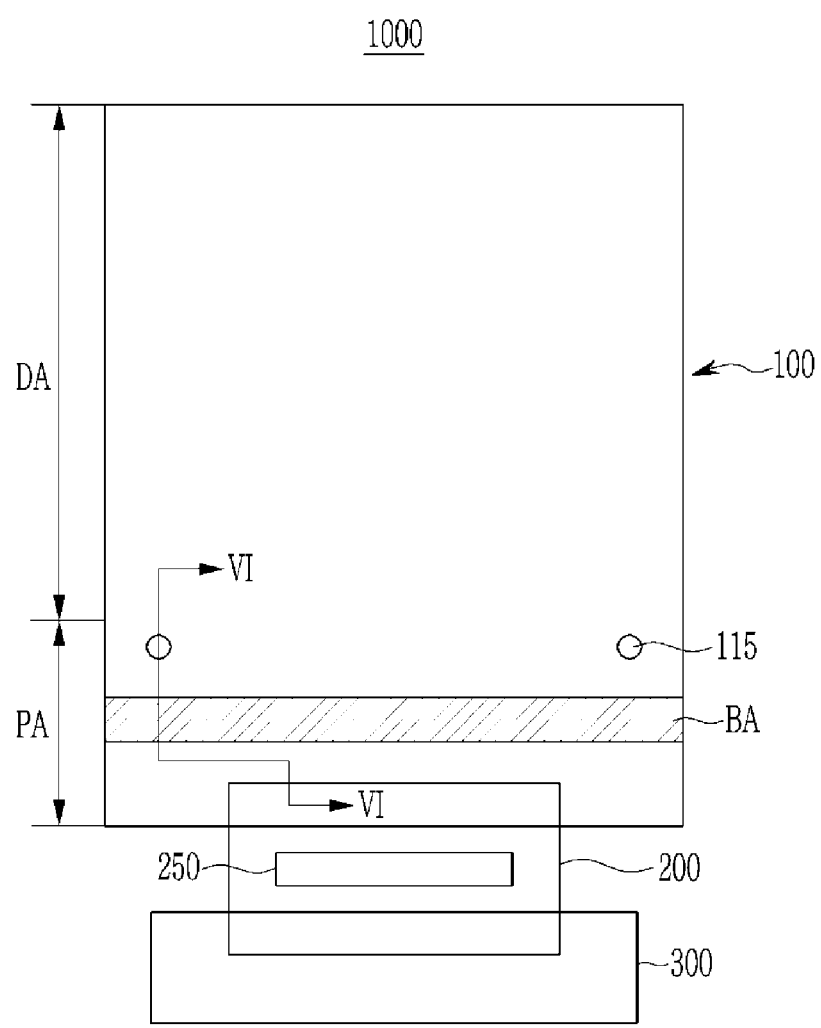
FIG. 5 is a view schematically showing an example of a layout of a display device according to an exemplary embodiment of the present invention.

FIG. 5 is a view schematically showing an example of a layout of a display device according to an exemplary embodiment of the present invention; FIG. 6 is a view schematically showing an example of a partial cross-sectional view taken along the line VI-VI of FIG. 5; and FIG. 7 is a view schematically showing a partial side view of a state in which the display device of FIG. 5 is bent.

Figure 6:
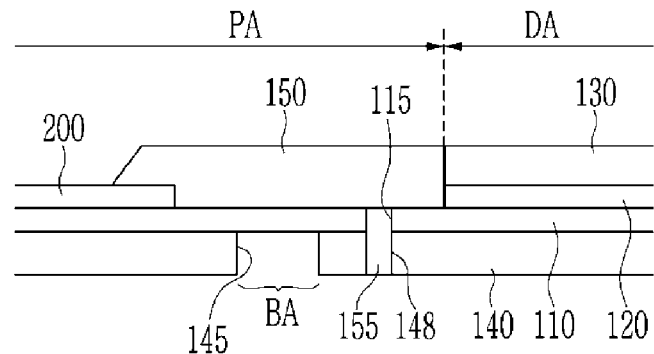
FIG. 6 is a view schematically showing an example of a partial cross-sectional view taken along the line VI-VI of FIG. 5.
Figure 7:
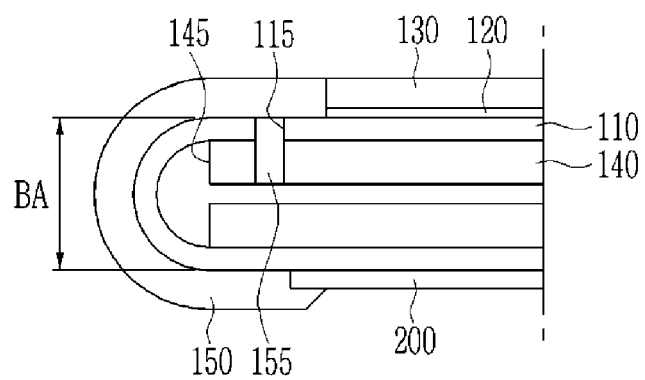
FIG. 7 is a view schematically showing a partial side view of a state in which the display device of FIG. 5 is bent.

Referring to FIG. 5 to FIG. 7, the display device according to the present exemplary embodiment includes the display panel 100, the printed circuit board (PCB) 300, and the flexible printed circuit film 200 connecting the display panel 100 and the printed circuit board (PCB) 300.

The display panel 100 includes the display area DA to display an image, and the non-display area PA in which the elements and/or the wires for generating and/or transmitting various signals applied to the display area DA are formed. Also, the display panel 100 includes the bending area BA. The bending area BA is disposed at the non-display area PA.

In an embodiment, the display panel 100 also includes a through hole 115 formed at the non-display area PA. The through hole 115 is formed between the bending area BA and the display area DA. In the present exemplary embodiment, two through holes 115 are described; however, the present invention is not limited thereto, and three or more through holes may be formed.

The display panel 100 is bent in the bending area BA (referring to FIG. 7). In the present exemplary embodiment, the bending shape of the display panel 100 may be the same as the display device of FIG. 1.

The display panel 100 includes the substrate 110, the display active layer 120, the polarization layer 130, the supporting member 140, and the protection layer 150.

The display active layer 120 is disposed on the substrate 110 and is disposed at the display area DA. The polarization layer 130 is disposed on the display active layer 120. The protection layer 150 is disposed on the substrate 110 and is disposed at the non-display area PA. The protection layer 150 has the function of covering the bending area BA and protecting the bending area BA. As described above, the elements and/or the wires for generating and/or transmitting the various signals applied to the display area DA are disposed in the non-display area PA. Although not shown, these elements and wires are disposed on the substrate 110 along with the insulating layer. In this case, the insulating layer may include the inorganic layer or the organic layer. Here, the protection layer 150 may have a function of protecting the elements, the wires, and the insulating layer disposed in the non-display area PA.

In an embodiment, the supporting member 140 is disposed under the substrate 110. The structure of the display active layer 120 according to the present exemplary embodiment may be the same as that of the display device shown in FIG. 1.

The substrate 110 includes the material having flexibility. The supporting member 140 includes the opening 145 overlapping with the bending area BA.

In an embodiment, the through hole 115 is disposed in the substrate 110 and the supporting member 140, and the through hole 115 penetrates the substrate 110 and the supporting member 140.

One side of the protection layer 150 is in contact with a side surface of the polarization layer 130, and the other side of the protection layer 150 is disposed on the flexible printed circuit film 200. The flexible printed circuit film 200 is attached to the substrate 110. In an embodiment, the protection layer 150 includes a fixed part 155 disposed inside the through hole 115.

When bending the display panel 100, the adherence of one side of the protection layer 150 may be weakened due to the compressive force and the tensile force such that lifting defects may be generated, but, in the present exemplary embodiment, as the protection layer 150 includes the fixed part 155 disposed inside the through hole 115, the adherence of the protection layer 150 is improved by the fixed part 155, and, accordingly, when bending the display panel 100, the fixed part 155 of the protection layer 150 may prevent or substantially prevent one side of the protection layer 150 from being lifted. In an embodiment, the protection layer 150 may include the photo-hardening organic material.

In an embodiment, the display panel 100 may further include a window disposed on the polarization layer 130, and at least one functional sheet for heat radiation, light blocking, and insulation disposed under the substrate 110.

While this invention has been described in connection with what are presently considered to be some practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a display panel comprising a bending region; and
a flexible printed circuit film connected to the display panel,
wherein the display panel comprises:
a substrate;
a display active layer on the substrate to display an image;
a protection layer on the substrate, between the flexible printed circuit film and the display active layer, and comprising a first surface facing the substrate, a second surface opposite the first surface, and a side surface extending between the first surface and the second surface; and
a polarization layer on the display active layer,
wherein the polarization layer comprises an inclination part at a side surface thereof, and
the protection layer covers the bending region, and the side of the protection layer is in contact with the inclination part.

2. The display device of claim 1, wherein the display panel comprises a display area and a non-display area, and the bending region is located at the non-display area.

3. The display device of claim 2, wherein the polarization layer extends from the display area to the non-display area, and
the inclination part is located at the non-display area.

4. The display device of claim 3, wherein the inclination part has a reverse-tapered shape.

5. The display device of claim 4, wherein the protection layer comprises a photo-hardening organic material.

6. The display device of claim 5, wherein the flexible printed circuit film is attached to the substrate, and
another side of the protection layer is on the flexible printed circuit film.

7. The display device of claim 1, further comprising a supporting member under the substrate and comprising an opening overlapping with the bending region.

8. The display device of claim 1, wherein the display panel is bent at the bending region.

9. A display device comprising:
a display panel comprising a bending region; and
a flexible printed circuit film connected to the display panel,
wherein the display panel comprises:
a substrate in which a through hole is located;
a display active layer on the substrate to display an image;
a protection layer on the substrate and between the flexible printed circuit film and the display active layer; and
a supporting member under the substrate,
wherein the through hole penetrates the substrate and the supporting member, and
the protection layer covers the bending region and includes a fixed part inside the through hole.

10. The display device of claim 9, wherein the display panel comprises a display area and a non-display area, and the bending region is located at the non-display area.

11. The display device of claim 10, wherein the through hole is located between the bending region and the display area.

12. The display device of claim 11, wherein the protection layer comprises a photo-hardening organic material.

13. The display device of claim 12, further comprising a polarization layer on the display active layer, and
wherein a side of the protection layer is in contact with a side surface of the polarization layer.

14. The display device of claim 13, wherein the flexible printed circuit film is attached to the substrate, and
another side of the protection layer is on the flexible printed circuit film.

15. The display device of claim 9, wherein the supporting member includes an opening overlapping with the bending region.

16. The display device of claim 9, wherein the display panel is bent in the bending region.

* * * * *